United States Patent
Bromberger

(10) Patent No.: US 7,425,865 B2
(45) Date of Patent: Sep. 16, 2008

(54) DIFFERENTIAL CASCODE AMPLIFIER

(75) Inventor: Christoph Bromberger, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 74 days.

(21) Appl. No.: 11/646,484

(22) Filed: Dec. 28, 2006

(65) Prior Publication Data

US 2007/0146070 A1 Jun. 28, 2007

(30) Foreign Application Priority Data

Dec. 28, 2005 (DE) .................. 10 2005 062 767

(51) Int. Cl.
*H03F 3/45* (2006.01)
(52) U.S. Cl. ....................... 330/252; 330/98
(58) Field of Classification Search .................. 330/98, 330/150, 252, 310
See application file for complete search history.

(56) References Cited

U.S. PATENT DOCUMENTS

| 4,146,844 | A | * | 3/1979 | Quinn | 330/149 |
|---|---|---|---|---|---|
| 4,267,516 | A | * | 5/1981 | Traa | 330/149 |
| 5,345,346 | A | | 9/1994 | Brannon et al. | |
| 5,389,891 | A | | 2/1995 | Philippe | |
| 5,418,491 | A | | 5/1995 | Bowers | |
| 5,493,254 | A | | 2/1996 | Fairgrieve | |
| 6,566,949 | B1 | * | 5/2003 | Park | 330/252 |
| 7,068,104 | B2 | * | 6/2006 | Burns et al. | 330/253 |
| 7,109,793 | B2 | | 9/2006 | Nakatani et al. | |
| 7,233,772 | B1 | * | 6/2007 | Darabi et al. | 455/20 |
| 2001/0054888 | A1 | | 12/2001 | Ueno et al. | |
| 2002/0093752 | A1 | | 7/2002 | Pakriswamy et al. | |

FOREIGN PATENT DOCUMENTS

| EP | 0 300 494 A2 | 1/1989 |
|---|---|---|
| EP | 1 187 313 A1 | 3/2002 |
| EP | 1 306 970 A2 | 5/2003 |
| EP | 1 480 333 A2 | 11/2004 |

OTHER PUBLICATIONS

Ulrich Tietze et al., "Halbleiter-Schaltungstechnik," 11th Edition, Berlin (among others), Springer Verlag, 1999; pp. 345-351, and pp. 392-394; ISBN 3-540-64192-0.
Alan B. Grebene, "Bipolar and MOS analog integrated circuit design," New York (among others), John Wiley& Sons, 1984; pp. 415, 416.

* cited by examiner

*Primary Examiner*—Henry K Choe
(74) *Attorney, Agent, or Firm*—Muncy, Geissler, Olds & Lowe, PLLC

(57) ABSTRACT

A differential cascode amplifier is disclosed that includes in each branch two transistors connected to form a cascode circuit, and has a cross-compensation (neutralization) with at least one pair of capacitors for compensating a parasitic capacitance of a transistor of each branch, wherein in each case, one capacitor of the pair is equal to the parasitic capacitance of the transistor of the associated branch.

13 Claims, 3 Drawing Sheets

DIFFERENTIAL CASCODE AMPLIFIER

This nonprovisional application claims priority under 35 U.S.C. §119(a) on German Patent Application No. DE 102005062767, which was filed in Germany on Dec. 28, 2005, and which is herein incorporated by reference.

BACKGROUND OF THE INVENTION

1. Field of the Invention

The present invention relates to an integrated differential cascode amplifier.

2. Description of the Background Art

High frequency amplifiers are required for a variety of applications. For instance, high frequency amplifiers are used to amplify radio signals that are received or are to be transmitted. In addition, high frequency amplifiers are used in mobile telephones and radar systems. For many applications, it is sufficient for the amplifier to amplify only a small frequency band in the vicinity of an operating frequency. Such an amplifier is also called a selective amplifier. Examples of prior art amplifier circuits are the differential amplifier and the cascode amplifier.

An arrangement of two transistors as a cascode amplifier accomplishes the result that a Miller effect which occurs in transistors in a common emitter circuit is negligible, so that the frequency response of the cascode amplifier is independent of the base collector capacitance of the transistor in the common emitter circuit influencing the Miller effect.

A differential cascode amplifier is known from EP 1 480 333 A2, which corresponds to U.S. Pat. No. 7,109,793 for example. In addition, a negative feedback is disclosed wherein a first capacitor feeds the output of the first branch of the differential amplifier back to the input of the second branch of the differential amplifier. A second capacitor is connected to the output of the second branch and the input of the first branch of the differential amplifier for feedback. By means of the feedback, instabilities in the differential amplifier are reduced by limiting the frequency response.

SUMMARY OF THE INVENTION

It is an object of the present invention to provide a differential cascode amplifier.

To attain this object, a differential cascode amplifier is provided with two transistors connected to form a cascode circuit in each branch of the differential cascode amplifier. In addition, the differential cascode amplifier has at least one cross-compensation with at least one pair of capacitors. In different variant solutions, each of the capacitors of the pair compensates for a parasitic capacitance of the transistors of each cascode circuit.

In a first embodiment, the pair of capacitors serves to compensate a base-emitter capacitance of each branch of the differential cascode amplifier. In each case, one capacitor of the pair is equal to the base-emitter capacitance of the associated branch of the differential cascode amplifier. So that the applicable parasitic capacitance and the associated compensation capacitor are equal, the electrical parameters of both capacitors—such as capacitance value or the dependence of the capacitance value on a capacitor voltage—are matched to the degree achievable within the manufacturing process.

In a second embodiment, the pair of capacitors serves to compensate a base-collector capacitance of each branch of the differential cascode amplifier. In each case, one capacitor of the pair is equal to the base-collector capacitance of the associated branch of the differential cascode amplifier. So that the applicable parasitic capacitance and the associated compensation capacitor are equal, the electrical parameters of both capacitors—such as capacitance value or the dependence of the capacitance value on a capacitor voltage—are matched to the degree achievable within the manufacturing process.

In a third embodiment, the pair of capacitors serves to compensate a gate-source capacitance of each branch of the differential cascode amplifier. In each case, one capacitor of the pair is equal to the gate-source capacitance of the associated branch of the differential cascode amplifier. So that the applicable parasitic capacitance and the associated compensation capacitor are equal, the electrical parameters of both capacitors—such as capacitance value or the dependence of the capacitance value on a capacitor voltage—are matched to the degree achievable within the manufacturing process.

In a fourth embodiment, the pair of capacitors serves to compensate a gate-drain capacitance of each branch of the differential cascode amplifier. In each case, one capacitor of the pair is equal to the gate-drain capacitance of the associated branch of the differential cascode amplifier. So that the applicable parasitic capacitance and the associated compensation capacitor are equal, the electrical parameters of both capacitors—such as capacitance value or the dependence of the capacitance value on a capacitor voltage—are matched to the degree achievable within the manufacturing process.

The above-described embodiments can of course also be combined with one another, e.g., in order to compensate different parasitic capacitances of the transistors. In contrast to negative feedback, which feeds the signal from the output back to the input of the differential cascode amplifier, cross-compensation—which is also called neutralization—achieves the effect that the acting parasitic capacitance of the transistor is compensated in that the negative capacitance value is added arithmetically to a capacitance value.

In addition, the object is attained by a differential cascode amplifier with a suitable circuit. Said circuit has at least a first transistor, a second transistor, a third transistor, and a fourth transistor. In addition, the differential cascode amplifier can also have, for example, components for setting the operating point of the transistors and/or active or passive impedances.

The first transistor has a first base, a first collector, and a first emitter, wherein the first base of the first transistor is connected to a first input of the differential cascode amplifier. The second transistor has a second base, a second collector, and a second emitter, wherein the second base of the second transistor is connected to a second input of the differential cascode amplifier. Preferably, the first transistor and the second transistor are identical within the scope of manufacturing tolerances.

The third transistor has a third base, a third collector, and a third emitter. In this context, the emitter of the third transistor is connected to the collector of the first transistor. The fourth transistor has a fourth base, a fourth collector, and a fourth emitter. In this context, the fourth emitter of the fourth transistor is connected to the second collector of the second transistor. Preferably, the third transistor and the fourth transistor are identical within the scope of manufacturing tolerances.

A plurality of variants of the invention are provided, each of which is associated with a parasitic capacitance of the transistors. In a first variant, the differential cascode amplifier has a first pair of capacitors that are arranged symmetrically, in particular. In this context, a first capacitor of the first pair of capacitors is connected to the third base of the third transistor and to the fourth emitter of the fourth transistor. The value of the first capacitor of the first pair preferably corresponds to the base-emitter capacitance of the third transistor, and is advantageously composed of a base-emitter capacitance of another transistor. A second capacitor of the first pair is connected to the fourth base of the fourth transistor, and to the third emitter of the third transistor. The value of the second capacitor of the first pair preferably corresponds to the base-emitter capacitance of the fourth transistor, and is advantageously composed of a base-emitter capacitance of another transistor.

In a second variant, the differential cascode amplifier has a second pair of capacitors that are arranged symmetrically, in particular. In this context, a first capacitor of the second pair of capacitors is connected to the third base of the third transistor and to the fourth collector of the fourth transistor. The value of the first capacitor of the second pair of capacitors preferably corresponds to the base-collector capacitance of the third transistor, and is advantageously composed of a base-collector capacitance of another transistor. A second capacitor of the first pair is connected to the fourth base of the fourth transistor, and to the third collector of the third transistor. The value of this second capacitor of the second pair preferably corresponds to the base-collector capacitance of the fourth transistor, and is advantageously composed of a base-collector capacitance of another transistor.

In a third variant, the differential cascode amplifier has a third pair of capacitors that are arranged symmetrically, in particular. In this context, a first capacitor of the third pair of capacitors is connected to the first base of the first transistor and to the second emitter of the second transistor. The value of the first capacitor of the third pair of capacitors preferably corresponds to the base-emitter capacitance of the first transistor, and is advantageously composed of a base-emitter capacitance of another transistor. A second capacitor of the third pair is connected to the second base of the second transistor, and to the first emitter of the first transistor. The value of the second capacitor of the third pair preferably corresponds to the base-emitter capacitance of the second transistor, and is advantageously composed of a base-emitter capacitance of another transistor.

In a fourth variant, the differential cascode amplifier has a fourth pair of capacitors that are arranged symmetrically, in particular. In this context, a first capacitor of the fourth pair of capacitors is connected to the first base of the first transistor and to the second collector of the second transistor. The value of the first capacitor of the fourth pair preferably corresponds to the base-collector capacitance of the first transistor, and is advantageously composed of a base-collector capacitance of another transistor. The second capacitor of the fourth pair is connected to the second base of the second transistor, and to the first collector of the first transistor. The value of the second capacitor of the fourth pair preferably corresponds to the base-collector capacitance of the second transistor, and is advantageously composed of a base-collector capacitance of another transistor.

Each variant can be individually advantageous per se depending on the external circuit, for example a source impedance that the differential cascode amplifier can experience due to such things as a preceding stage, a matching circuit, or a receive antenna connected to the input of the differential cascode amplifier, or else a load impedance that the differential cascode amplifier can experience on account of a transmit antenna connected to its output through a matching circuit.

An especially advantageous embodiment of the invention provides that the cascode differential amplifier has at least two pairs of capacitors, from among the first pair, the second pair, the third pair or the fourth pair. The differential cascode amplifier here can have at least two, but also three or four, of the aforementioned pairs of capacitors. By means of the appropriate combination of the four variants, the differential cascode amplifier can be implemented in eleven additional subsidiary variants; six subsidiary variants with two pairs of capacitors, four subsidiary variants with three pairs of capacitors, or one subsidiary variant with four pairs of capacitors. For example, as a function of an external circuit and/or a design of the individual transistors, a specific subsidiary variant can be especially advantageous.

In a preferred further development, the differential cascode amplifier is symmetrically designed. For symmetrical design, both branches of the differential cascode amplifier are preferably identical mirror images of one another within the scope of manufacturing tolerances.

In an advantageous further development, provision is made for the fourth pair of capacitors to be composed of a base-collector capacitance of a fifth transistor and a base-collector capacitance of a sixth transistor. The differential cascode amplifier here has the fifth transistor with a fifth base, a fifth collector, and a fifth emitter, wherein the fifth base of the fifth transistor is connected to the first base of the first transistor. In addition, the fifth collector of the fifth transistor is connected to the second collector of the second transistor. The differential cascode amplifier additionally has the sixth transistor with a sixth base, a sixth collector, and a sixth emitter. In this context, the sixth base of the sixth transistor is connected to the second base of the second transistor. In addition, the sixth collector of the sixth transistor is connected to the first collector of the first transistor. Preferably, the fifth emitter of the fifth transistor and the sixth emitter of the sixth transistor are DC-isolated from one another. In addition, the fifth emitter of the fifth transistor and the sixth emitter of the sixth transistor are preferably isolated from the rest of the circuit.

In further development of this embodiment, the sixth collector of the sixth transistor constitutes, together with the first collector of the first transistor and/or with the third emitter of the third transistor, a continuous first semiconductor region. This semiconductor region is thus not interrupted by metallic regions, but instead is formed as a single piece from a semiconductor material, for example silicon. In yet further development of this embodiment, the fifth collector of the fifth transistor constitutes, together with the second collector of the second transistor and/or with the fourth emitter of the fourth transistor, a continuous second semiconductor region. The first and the second semiconductor regions are preferably identical within the scope of manufacturing tolerances.

In another embodiment that also may be combined, provision is advantageously made for the third pair of capacitors to be composed of a base-emitter capacitance of a seventh transistor and a base-emitter capacitance of an eighth transistor. The differential cascode amplifier here has the seventh transistor with a seventh base, a seventh collector, and a seventh emitter. In this context, the seventh base of the seventh transistor is connected to the first base of the first transistor. In addition, the seventh emitter of the seventh transistor is connected to the second emitter of the second transistor. The differential cascode amplifier here additionally has the eighth transistor with an eighth base, an eighth collector, and an eighth emitter. In this context, the eighth base of the eighth transistor is connected to the second base of the second transistor. In addition, the eighth emitter of the eighth transistor is connected to the first emitter of the first transistor. Preferably, the seventh collector of the seventh transistor and the eighth collector of the eighth transistor are DC-isolated from one another. In addition, the seventh collector of the seventh transistor and the eighth collector of the eighth transistor are preferably isolated from the rest of the circuit.

In another embodiment that also may be combined, provision is advantageously made for the second pair of capacitors to be composed of a base-collector capacitance of a ninth transistor and a base-collector capacitance of a tenth transistor. The differential cascode amplifier here has the ninth transistor with a ninth base, a ninth collector, and a ninth emitter. In addition, the differential cascode amplifier has the tenth transistor with a tenth base, a tenth collector, and a tenth emitter. In this context, the ninth base of the ninth transistor is connected to the third base of the third transistor. In addition, the ninth collector of the ninth transistor is connected to the fourth collector of the fourth transistor. In addition, the tenth base of the tenth transistor is connected to the fourth base of the fourth transistor. In addition, the tenth collector of the tenth transistor is connected to the third collector of the third transistor. Preferably, the ninth emitter of the ninth transistor and the tenth emitter of the tenth transistor are DC-isolated from one another. In addition, the ninth emitter of the ninth transistor and the tenth emitter of the tenth transistor are preferably isolated from the rest of the circuit.

In yet another embodiment that also may be combined, provision is advantageously made for the first pair of capacitors to be composed of a base-emitter capacitance of an eleventh transistor and a base-emitter capacitance of a twelfth transistor. The differential cascode amplifier here has the eleventh transistor with an eleventh base, an eleventh collector, and an eleventh emitter. In addition, the differential cascode amplifier has the twelfth transistor with a twelfth base, a twelfth collector, and a twelfth emitter. In this context, the eleventh base of the eleventh transistor is connected to the third base of the third transistor. The eleventh emitter of the eleventh transistor is connected to the fourth emitter of the fourth transistor. In addition, the twelfth base of the twelfth transistor is connected to the fourth base of the fourth transistor. In addition, the twelfth emitter of the twelfth transistor is connected to the third emitter of the third transistor. Preferably, the eleventh collector of the eleventh transistor and the twelfth collector of the twelfth transistor are DC-isolated from one another. In addition, the eleventh collector of the eleventh transistor and the twelfth collector of the twelfth transistor are preferably isolated from the rest of the circuit.

The differential cascode amplifier is designed to amplify a high frequency signal. High frequency here is defined as a frequency range in which the transient behavior of an individual transistor is significantly influenced by parasitic capacitances of the transistor and in particular by the Miller effect.

In a further embodiment of the invention, at least one matching network is provided to form a selective amplifier, in particular a bandpass amplifier, which is connected to at least one transistor. Such a matching network can be composed of multiple active and/or passive components, such as integrated capacitors, inductors, or diodes.

At least one transistor can be a hetero bipolar transistor. To produce a bipolar transistor of this nature with a hetero pn junction, a silicon/germanium mixed crystal is advantageously formed.

The differential cascode amplifier can be integrated on a semiconductor chip. In an embodiment of the invention, the sixth collector of the sixth transistor constitutes, together with the first collector of the first transistor and/or the third emitter of the third transistor, a continuous first semiconductor region, which thus is not interrupted by metallic connections. In advantageous fashion, this semiconductor region is made of monocrystalline silicon, which is doped only with dopants of a single conductivity type, for example an n-type conductivity. In addition, it is especially preferred for provision to be made for the fifth collector of the fifth transistor to constitute, together with the second collector of the second transistor and/or with the fourth emitter of the fourth transistor, a continuous second semiconductor region, in particular made of monocrystalline silicon doped with the same conductivity type.

In a further embodiment of the invention, provision is made for the differential cascode amplifier to have field-effect transistors in place of at least some bipolar transistors, wherein the field-effect transistors are connected in each case to a gate instead of a base, a drain instead of a collector, and a source instead of an emitter. It is likewise advantageous, in a circuit with different transistor types, to connect one or more bipolar transistors in addition to one or more field-effect transistors, within the differential cascode amplifier.

It is likewise possible in a differential amplifier to neutralize different parasitic capacitances by means of multiple cross-compensation. In this context, the differential amplifier has a first transistor, a second transistor, a third transistor, and a fourth transistor. The first transistor has a first base, a first collector, and a first emitter, wherein the first transistor is connected to a first input. The second transistor has a second base, a second collector, and a second emitter, wherein the second transistor is connected to a second input. In three different variants of the invention, the first transistor and the second transistor are connected in a common emitter circuit or in a common base circuit or in a common collector circuit. The third transistor has a third base, a third collector, and a third emitter, with the third base of the third transistor being connected to the first base of the first transistor and the third emitter of the third transistor being connected to the first emitter of the first transistor. The fourth transistor has a fourth base, a fourth collector, and a fourth emitter, with the fourth base of the fourth transistor being connected to the second base of the second transistor and the fourth emitter of the fourth transistor being connected to the second emitter of the second transistor.

It is possible for the first transistor and the second transistor to be identical within the scope of manufacturing tolerances. In like manner, the third transistor and the fourth transistor may be identical within the scope of manufacturing tolerances. The first transistor and/or the second transistor and/or the third transistor and/or the fourth transistor can be arranged adjacent to one another on a semiconductor chip.

The differential amplifier can have a fifth transistor and a sixth transistor. The fifth transistor has a fifth base, a fifth collector, and a fifth emitter. The sixth transistor has a sixth base, a sixth collector, and a sixth emitter. The fifth base of the fifth transistor is connected to the first base of the first transistor, and the fifth collector of the fifth transistor is connected to the second collector of the second transistor. The sixth base of the sixth transistor is connected to the second base of the second transistor, and the sixth collector of the sixth transistor is connected to the first collector of the first transistor. All transistors may be integrated on a semiconductor chip. At least the first transistor and the fifth transistor and/or the second transistor and the sixth transistor can have identical base-collector capacitances within the scope of manufacturing tolerances.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Four example embodiments of amplifier circuits are shown in FIGS. 1 through 4. In addition to the components shown in FIGS. 1 through 4, additional passive and/or active components, for example for signal decoupling or for setting the operating point, may be integrated on a semiconductor chip. For the sake of simplicity, these additional components are omitted from FIGS. 1 through 4.

One advantage of a cascode circuit resides in the compensation of the Miller effect. Due to a high output voltage swing, the base-collector capacitance of a transistor operated in a common emitter circuit in the equivalent schematic appears between input and ground, effectively multiplied by the current gain. If an impedance-converting transistor in a common-base circuit is selected as the load for a current-amplifying transistor in a common-emitter circuit, the collector of the transistor in the common-emitter circuit experiences an output voltage swing that is determined by the small input resistance of the impedance-converting stage (common base circuit) instead of by a higher load resistance. The Miller effect, which increases the base-collector capacitance of the transistor operated in a common emitter circuit by the gain factor, is essentially eliminated through the use of the cascode circuit. The same also applies for two cascodes, which are connected in each branch of a differential amplifier.

An alternative way to reduce the Miller capacitance is to compensate the base-collector capacitance through cross-compensation, which is also called neutralization (Alan Grebene, *Bipolar and MOS Analog Integrated Circuit Design*, John Wiley, 1984, p. 415 ff). In this process, a capacitance between the base in the first branch of the differential amplifier and the collector in the second branch of the differential amplifier experiences a voltage swing that is equal in magnitude and opposite to the voltage swing at the base-collector capacitance in the first branch of the differential amplifier, as long as the capacitances are equal. By this means, a second capacitance with a Miller factor of −1 is effectively connected in parallel to the base-collector capacitance, thereby compensating the base-collector capacitance. Since the parallel-connected capacitance should follow the, e.g., voltage-dependent behavior of the base-collector capacitance, the base-collector capacitance of a dummy transistor on the same semiconductor chip is used for compensation.

Figure 1:
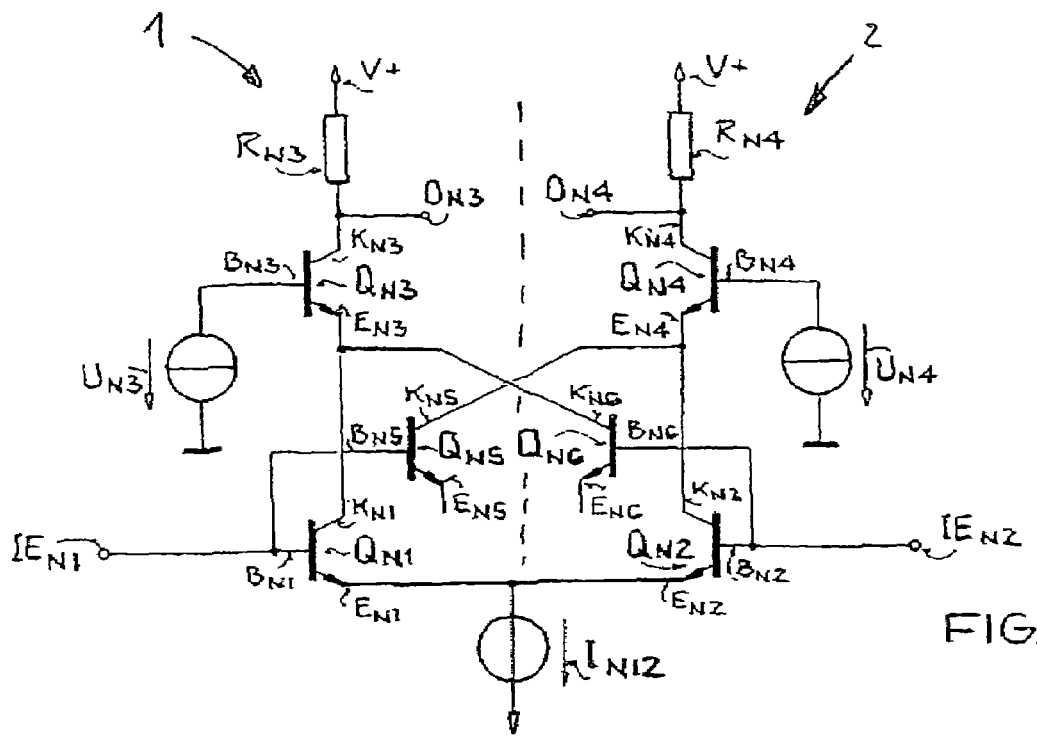
FIG. 1 illustrates a first embodiment of a circuit of a differential cascode amplifier with npn bipolar transistors.

Shown in FIG. 1 is a circuit of a differential cascode amplifier with six npn bipolar transistors $Q_{N1}$ through $Q_{N6}$. The differential cascode amplifier has two symmetrical branches 1 and 2. The axis of symmetry of the two branches is represented by a dashed line. The inputs $IE_{N1}$ and $IE_{N2}$ are connected to the bases $B_{N1}$ and $B_{N2}$ of the first npn bipolar transistor $Q_{N1}$ and the second npn bipolar transistor $Q_{N2}$. The first and second transistors $Q_{N1}$ and $Q_{N2}$ here are operated in a common emitter circuit. The transistors $Q_{N3}$ and $Q_{N4}$ are operated in a common base circuit. To this end, the applicable base $B_{N3}$ and $B_{N4}$ are each connected to a voltage source $U_{N3}$ and $U_{N4}$, which act as a short circuit to ground with respect to the operating frequency. The first transistor $Q_{N1}$ and the third transistor $Q_{N3}$ together constitute a first cascode. The second transistor $Q_{N2}$ and the fourth transistor $Q_{N4}$ together constitute a second cascode. As a result of the use of the two cascodes, neither the first transistor $Q_{N1}$ operated in a common emitter circuit nor the second transistor $Q_{N2}$, also operated in a common emitter circuit, exhibit any significant Miller effect with regard to their base-collector capacitance.

Even though there is no longer any significant Miller effect on account of the two cascodes, the fifth transistor $Q_{N5}$ and the sixth transistor $Q_{N6}$ are provided in the circuit in FIG. 1. The fifth transistor $Q_{N5}$ and the sixth transistor $Q_{N6}$ are wired in similar fashion to a cross-compensation, in that the fifth base $B_{N5}$ of the fifth transistor $Q_{N5}$ is connected to the first base $B_{N1}$ of the first transistor $Q_{N1}$ and the fifth collector $K_{N5}$ of the fifth transistor $Q_{N5}$ is connected to the second collector $K_{N2}$ of the second transistor $Q_{N2}$, and in that the sixth base $B_{N6}$ of the sixth transistor $Q_{N6}$ is connected to the second base $B_{N2}$ of the second transistor $Q_{N2}$ and the sixth collector $K_{N6}$ of the sixth transistor $Q_{N6}$ is connected to the first collector $K_{N1}$ of the first transistor $Q_{N1}$. The fifth and sixth emitters $E_{N5}$ and $E_{N6}$ are not connected here.

The cross-compensation serves no purpose with respect to the Miller effect, since the two cascodes already suppress the Miller effect. While the power gain and frequency behavior of a differential cascode amplifier are also essentially unaffected by this negative cross-feedback, the circuit in FIG. 1 has the advantage—surprising to those skilled in the art—that unconditional stability of the differential cascode amplifier can be ensured over a significantly wider operating range, in particular over a significantly larger range of supply voltage (V+ to V−) even without resistive feedback and thus without loss of gain. At the same time, the two cascodes permit a larger output voltage swing range than individual transistors in a common emitter circuit.

Figure 3:
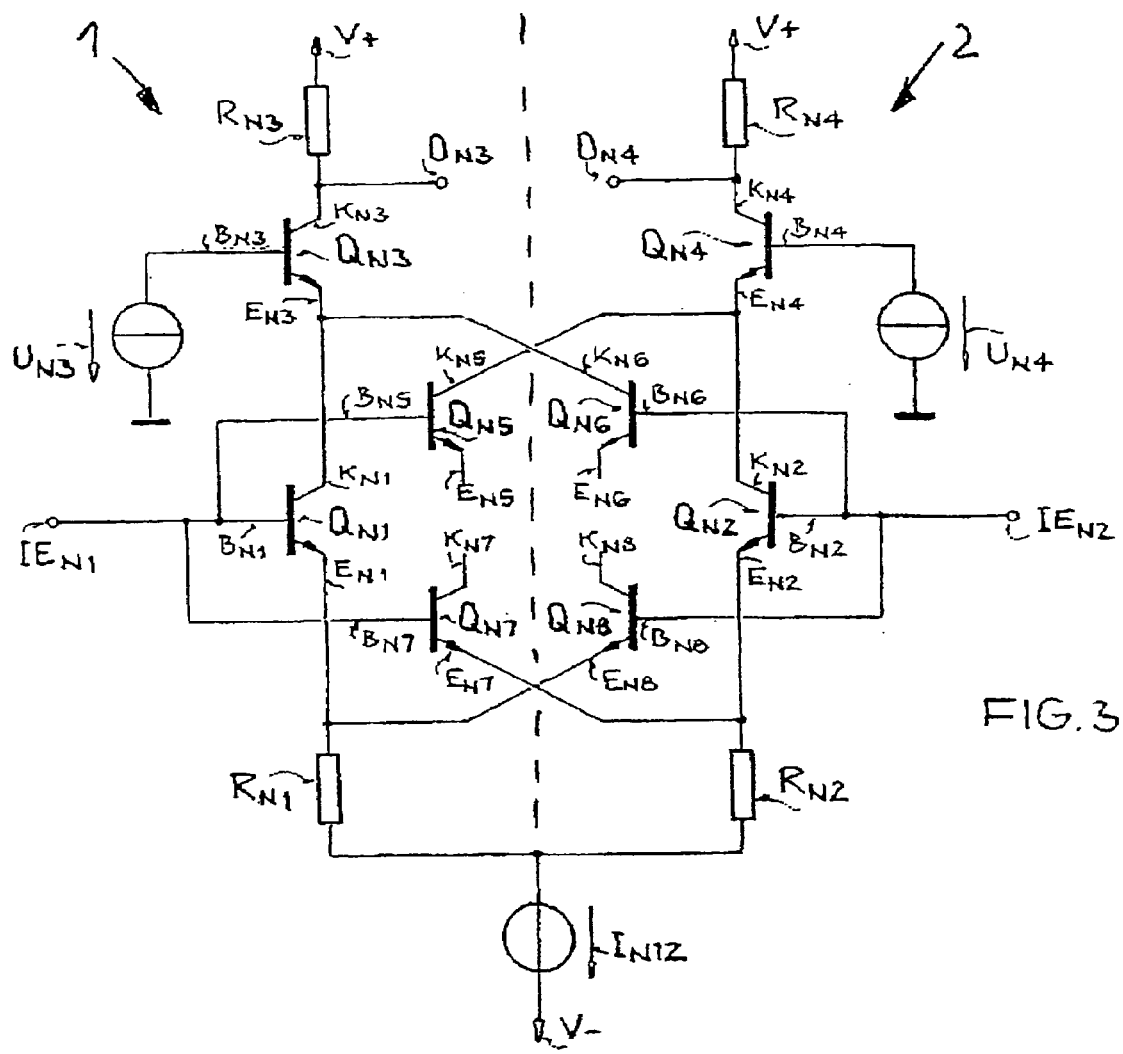
FIG. 3 illustrates a third embodiment of a circuit of a differential cascode amplifier with npn bipolar transistors.

In FIG. 3, the circuit of the differential cascode amplifier from FIG. 1 is augmented by a seventh transistor $Q_{N7}$ and an eighth transistor $Q_{N8}$. In this context, a seventh emitter $E_{N7}$ of the seventh transistor $Q_{N7}$ is connected to the second emitter $E_{N2}$ of the second transistor $Q_{N2}$, and an eighth emitter $E_{N8}$ of the eighth transistor $Q_{N8}$ is connected to the first emitter $E_{N1}$ of the first transistor $Q_{N1}$. In addition, a seventh base $B_{N7}$ of the seventh transistor $Q_{N7}$ is connected to the first base $B_{N1}$ of the first transistor $Q_{N1}$, and an eighth base $B_{N8}$ of the eighth transistor $Q_{N8}$ is connected to the second base $B_{N2}$ of the second transistor $Q_{N2}$. The differential cascode amplifier has two symmetrical branches 1 and 2. The axis of symmetry of the two branches is represented by a dashed line.

In similar fashion to the negative cross-feedback through the fifth and sixth transistors $Q_{N5}$ and $Q_{N6}$, the seventh transistor $Q_{N7}$ compensates the base-emitter capacitance of the first transistor $Q_{N1}$, and the eighth transistor $Q_{N8}$ compensates the base-emitter capacitance of the second transistor $Q_{N2}$, further improving the stability and gain characteristics of the circuit.

Figure 4:
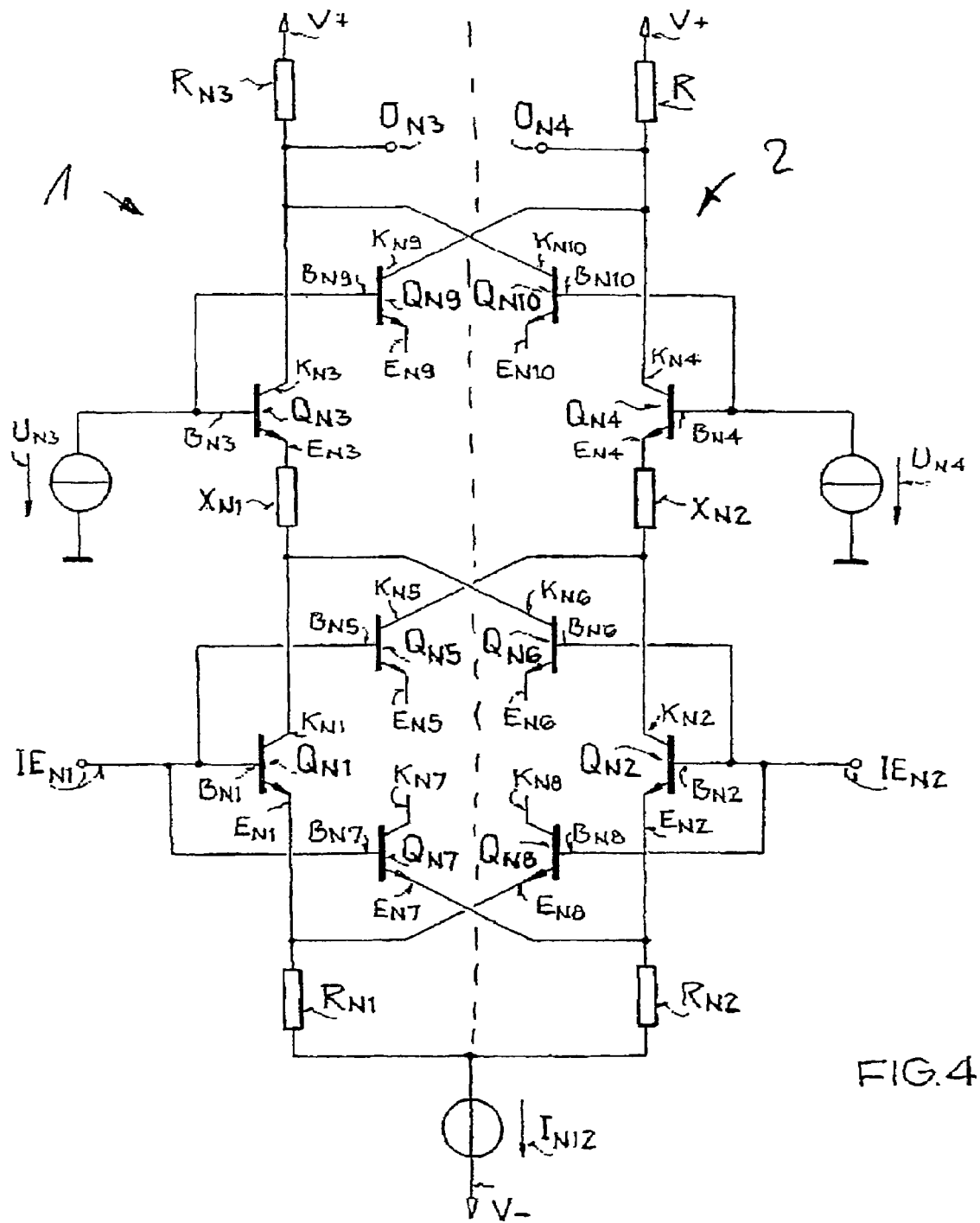
FIG. 4 illustrates a fourth embodiment of a circuit of a differential cascode amplifier with npn bipolar transistors.

In the circuit from FIG. 4, the circuit from FIG. 3 is augmented by a ninth transistor $Q_{N9}$ and a tenth transistor $Q_{N10}$. The ninth transistor $Q_{N9}$ compensates the base-collector capacitance of the third transistor $Q_{N3}$. The tenth transistor $Q_{N10}$ compensates the base-collector capacitance of the fourth transistor $Q_{N4}$. In this context, a ninth collector $K_{N9}$ of the ninth transistor $Q_{N9}$ is connected to the fourth collector $K_{N4}$ of the fourth transistor $Q_{N4}$, and a tenth collector $K_{N10}$ of the tenth transistor $Q_{N10}$ is connected to the third collector $K_{N3}$ of the third transistor $Q_{N3}$. In addition, a ninth base $B_{N9}$ of the ninth transistor $Q_{N9}$ is connected to the third base $B_{N3}$ of the third transistor $Q_{N3}$, and a tenth base $B_{N10}$ of the tenth transistor $Q_{N10}$ is connected to the fourth base $B_{N4}$ of the fourth transistor $Q_{N4}$. The ninth and tenth emitters $E_{N9}$ and $E_{N10}$ are not connected here. The differential cascode amplifier has two symmetrical branches 1 and 2. The axis of symmetry of the two branches is represented by a dashed line.

FIG. 4 also shows two matching networks $X_{N1}$ and $X_{N2}$, which are tuned to the operating frequency of the amplifier. It is advantageous for such matching networks to have passive components, such as capacitors and inductors, which are connected to the first transistor $Q_{N1}$ and/or the second transistor $Q_{N2}$ to create, for example, a selective amplifier or a broadband amplifier. By means of two additional transistors, not shown in FIG. 4, moreover, the base-emitter capacitance of the third transistor $Q_{N3}$ as well as the base-emitter capacitance of the fourth transistor $Q_{N4}$ can be compensated.

It is preferable for the operating points of the ten transistors $Q_{N1}$ through $Q_{N10}$ and the voltage swing of the differential cascode amplifier to be designed such that an unconditionally stable region is produced along a load line in the family of output characteristic curves.

Figure 2:
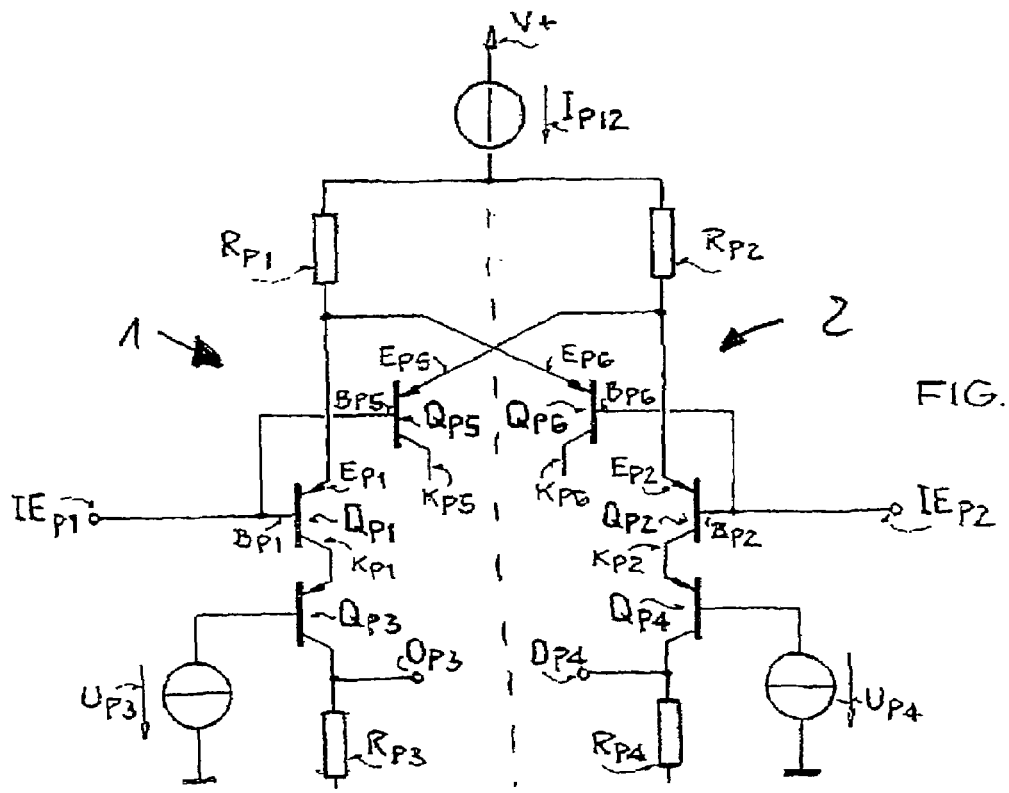
FIG. 2 illustrates a second embodiment of a circuit of a differential cascode amplifier with pnp bipolar transistors.

FIG. 2 shows another example embodiment of a differential cascode amplifier with six pnp bipolar transistors $Q_{P1}$ through $Q_{P6}$. The differential cascode amplifier has two symmetrical branches 1 and 2. The axis of symmetry of the two branches is represented by a dashed line. The first transistor $Q_{P1}$ in a common emitter circuit together with the third transistor $Q_{P3}$ in a common base circuit, and the second transistor $Q_{P2}$ in a common emitter circuit together with the fourth transistor $Q_{P4}$ in a common base circuit, are connected as a cascode in each case. The fifth transistor $Q_{P5}$ is connected to compensate the base-emitter capacitance of the first transistor $Q_{P1}$, and the sixth transistor $Q_{P6}$ is connected to compensate the second transistor $Q_{P2}$.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A differential cascode amplifier comprising:
    two transistors wired to form a cascode circuit in a first and second branch of the differential cascode amplifier; and
    a cross-compensation having at least one pair of capacitors,
    wherein, for compensating a base-emitter capacitance of each of the first and second branch, one capacitor of the pair is equal to a base-emitter capacitance of the associated branch, and/or
    wherein, for compensating a base-collector capacitance of each branch, one capacitor of the pair is equal to the base-collector capacitance of the associated branch, and/or
    wherein, for compensating a gate-source capacitance of each branch, one capacitor of the pair is equal to the gate-source capacitance of the associated branch, and/or
    wherein, for compensating a gate-drain capacitance of each branch, one capacitor of the pair is equal to the gate-drain capacitance of the associated branch.

2. The differential cascode amplifier according to claim 1, further comprising:
    a first transistor with a first base, a first collector, and a first emitter, wherein the first base is connected to a first input;
    a second transistor with a second base, a second collector, and a second emitter, wherein the second base is connected to a second input;
    a third transistor with a third base, a third collector, and a third emitter, wherein the third emitter of the third transistor is connected to the first collector of the first transistor;
    a fourth transistor with a fourth base, a fourth collector, and a fourth emitter, wherein the fourth emitter of the fourth transistor is connected to the second collector of the second transistor; and
    a first pair of capacitors, wherein a first capacitor of the first pair is connected to the third base of the third transistor and to the fourth emitter of the fourth transistor, and wherein a second capacitor of the first pair is connected to the fourth base of the fourth transistor and to the third emitter of the third transistor.

3. The differential cascode amplifier according to claim 1, further comprising
    a first transistor with a first base, a first collector, and a first emitter, wherein the first base is connected to a first input;
    a second transistor a second base, a second collector, and a second emitter, wherein the second base is connected to a second input;
    a third transistor with a third base, a third collector, and a third emitter, wherein the third emitter of the third transistor is connected to the first collector of the first transistor;
    a fourth transistor with a fourth base, a fourth collector, and a fourth emitter, wherein the fourth emitter of the fourth transistor is connected to the second collector of the second transistor; and
    a second pair of capacitors, wherein a first capacitor of the second pair is connected to the third base of the third transistor and to the fourth collector of the fourth transistor, and wherein a second capacitor of the second pair is connected to the fourth base of the fourth transistor and to the third collector of the third transistor.

4. The differential cascode amplifier according to claim 1, further comprising:
    a first transistor with a first base, a first collector, and a first emitter, wherein the first base is connected to a first input;
    a second transistor with a second base, a second collector, and a second emitter, wherein the second base is connected to a second input;
    a third transistor with a third base, a third collector, and a third emitter, wherein the third emitter of the third transistor is connected to the first collector of the first transistor;
    a fourth transistor with a fourth base, a fourth collector, and a fourth emitter, wherein the fourth emitter of the fourth transistor is connected to the second collector of the second transistor; and
    a third pair of capacitors, wherein a first capacitor of the third pair is connected to the first base of the first transistor and to the second emitter of the second transistor, and wherein a second capacitor of the third pair is connected to the second base of the second transistor and to the first emitter of the first transistor.

5. The differential cascode amplifier according to claim 1, further comprising:
- a first transistor with a first base, a first collector, and a first emitter, wherein the first base is connected to a first input;
- a second transistor with a second base, a second collector, and a second emitter, wherein the second base is connected to a second input;
- a third transistor with a third base, a third collector, and a third emitter, wherein the third emitter of the third transistor is connected to the first collector of the first transistor;
- a fourth transistor with a fourth base, a fourth collector, and a fourth emitter, wherein the fourth emitter of the fourth transistor is connected to the second collector of the second transistor; and
- a fourth pair of capacitors, wherein a first capacitor of the fourth pair is connected to the first base of the first transistor and to the second collector of the second transistor, and wherein a second capacitor of the fourth pair is connected to the second base of the second transistor and to the first collector of the first transistor.

6. The differential cascode amplifier according to claim 2, wherein the differential cascade amplifier has at least two pairs of capacitors from among the first pair of capacitors.

7. The differential cascode amplifier according to claim 2, wherein at least one capacitor of the pair of capacitors is composed of a base-emitter capacitance or a base-collector capacitance of a transistor.

8. The differential cascode amplifier according to claim 5,
- wherein the fourth pair of capacitors is comprised of a base-collector capacitance of a fifth transistor and a base-collector capacitance of a sixth transistor,
- wherein the fifth transistor has a fifth base, a fifth collector, and a fifth emitter, wherein the fifth base of the fifth transistor is connected to the first base of the first transistor, wherein the fifth collector of the fifth transistor is connected to the second collector of the second transistor, and
- wherein the sixth transistor has a sixth base, a sixth collector, and a sixth emitter, wherein the sixth base of the sixth transistor is connected to the second base of the second transistor, wherein the sixth collector of the sixth transistor is connected to the first collector of the first transistor.

9. The differential cascode amplifier according to claim 4,
- wherein the third pair of capacitors is comprised of a base-emitter capacitance of a seventh transistor and a base-emitter capacitance of an eighth transistor,
- wherein the seventh transistor has a seventh base, a seventh collector, and a seventh emitter, wherein the seventh base of the seventh transistor is connected to the first base of the first transistor, wherein the seventh emitter of the seventh transistor is connected to the second emitter of the second transistor, and
- wherein the eighth transistor has an eighth base, an eighth collector, and an eighth emitter, wherein the eighth base of the eighth transistor is connected to the second base of the second transistor, wherein the eighth emitter of the eighth transistor is connected to the first emitter of the first transistor.

10. The differential cascode amplifier according to claim 3,
- wherein the second pair of capacitors is comprised of a base-collector capacitance of a ninth transistor and a base-collector capacitance of a tenth transistor,
- wherein the ninth transistor has a ninth base, a ninth collector, and a ninth emitter, and
- wherein the tenth transistor has a tenth base, a tenth collector, and a tenth emitter,
- wherein the ninth base of the ninth transistor is connected to the third base of the third transistor, the ninth collector of the ninth transistor is connected to the fourth collector of the fourth transistor, the tenth base of the tenth transistor is connected to the fourth base of the fourth transistor, and the tenth collector of the tenth transistor is connected to the third collector of the third transistor.

11. The differential cascode amplifier according to claim 2,
- wherein the first pair of capacitors is comprised of a base-emitter capacitance of an eleventh transistor and a base-emitter capacitance of a twelfth transistor,
- wherein the eleventh transistor has an eleventh base, an eleventh collector, and an eleventh emitter, and
- wherein the twelfth transistor has a twelfth base, a twelfth collector, and a twelfth emitter,
- wherein the eleventh base of the eleventh transistor is connected to the third base of the third transistor, the eleventh emitter of the eleventh transistor is connected to the fourth emitter of the fourth transistor, the twelfth base of the twelfth transistor is connected to the fourth base of the fourth transistor, and the twelfth emitter of the twelfth transistor is connected to the third emitter of the third transistor.

12. The differential cascode amplifier according to claim 1, further comprising at least one matching network, which is connected to at least one transistor.

13. The differential cascode amplifier according to claim 1, wherein the transistors are field-effect transistors, each of which is connected to a gate, a drain, and a source.

* * * * *